(12) United States Patent
Huang

(10) Patent No.: US 8,054,105 B2
(45) Date of Patent: Nov. 8, 2011

(54) SAMPLE HOLD CIRCUIT AND METHOD FOR SAMPLING AND HOLDING SIGNAL

(75) Inventor: Chih-Haur Huang, Tainan County (TW)

(73) Assignee: Himax Media Solution, Inc., Tainan (TW)

( * ) Notice: Subject to any disclaimer, the term of this patent is extended or adjusted under 35 U.S.C. 154(b) by 62 days.

(21) Appl. No.: 12/639,009

(22) Filed: Dec. 16, 2009

(65) Prior Publication Data
US 2011/0140939 A1 Jun. 16, 2011

(51) Int. Cl.
*G11C 27/02* (2006.01)
*H03K 5/00* (2006.01)
*H03K 17/00* (2006.01)

(52) U.S. Cl. ............................................ 327/95; 327/96

(58) Field of Classification Search .................... 327/91, 327/94–97; 341/122–125
See application file for complete search history.

(56) References Cited

U.S. PATENT DOCUMENTS
5,698,999 A * 12/1997 Etoh et al. ........................ 327/94
6,184,726 B1 * 2/2001 Haeberli et al. ................. 327/96
* cited by examiner

*Primary Examiner* — Quan Tra
(74) *Attorney, Agent, or Firm* — Jianq Chyun IP Office

(57) ABSTRACT

A sample hold circuit and a method for sampling and holding a signal are provided. The sample hold circuit includes a sample unit, a direct current (DC) voltage elimination unit, and a hold unit. When the sample hold circuit is in a first state, the sample unit samples an input signal, and the DC voltage elimination unit lowers a predetermined percentage of the DC voltage in the input signal sampled by the sample unit. When the sample hold circuit is in a second state, the DC voltage elimination unit eliminates the residual percentage of the DC voltage, and the hold unit outputs the alternating current (AC) signal in the input signal sampled by the sample unit.

14 Claims, 11 Drawing Sheets

SAMPLE HOLD CIRCUIT AND METHOD FOR SAMPLING AND HOLDING SIGNAL

BACKGROUND OF THE INVENTION

1. Field of the Invention

The present invention generally relates to a sample hold circuit and a method for sampling and holding a signal, and more particularly, to a sample hold circuit of an analog-to-digital converter (ADC) and a method for sampling and holding a signal.

2. Description of Related Art

Most of physical signals generated in daily life are analog signals. However, since a digital signal is easy to be edited, analyzed, stored and has a better anti-noise capability, in an actual application, the analog signal is generally converted into the digital signal through an analog-to-digital converter (ADC).

The ADC plays an important role in wireless communication systems and portable video image devices, and as the wireless communication systems and the portable video image devices are quickly developed, demand for a high conversion speed of the ADC is increased. In various types of ADC structures, a pipelined ADC can achieve features of high-speed input and fast processing. In a general ADC, a sample hold circuit is generally disposed at a front end thereof, which is used for holding the analog signal. Since a sampling time is very short, a sampling output is a series of discontinuous narrow pulses, so that certain time is required to digitalize each of the sampled narrow pulse signals. Therefore, between two samplings, the sampled analog signal is temporarily stored until a next sampling pulse is received, and such operation is referred to as "hold". According to a basic principle of digital signal processing (i.e. the Nyquist sampling theorem), if the extracted analog signal is required to be accurately and truly rendered, a sampling frequency has to be higher than twice of a maximum frequency. Therefore, the conversion speed of the ADC is usually determined by an operation frequency of the sample hold circuit. As a signal processing speed of the ADC becomes higher, demand for the operation frequency of the corresponding sample hold circuit is accordingly increased. Therefore, to improve the operation frequency of the sample hold circuit to cope with an actual demand is an important subject.

FIG. 1 is a circuit diagram of a conventional sample hold circuit. Referring to FIG. 1, the sample hold circuit 100A includes switches SW1A-SW9A, capacitors C1A-C6A, and an operational amplifier 102A. The switches SW1A, SW2A, SW3A, SW6A, and SW9A are controlled by a first signal PH1 to be turned on when the sample hold circuit 100A is in a sampling state and to be turned off when the sample hold circuit 100A is in a holding state. Besides, the switches SW4A, SW5A, SW7A, and SW8A are controlled by a second signal PH2 to be turned off when the sample hold circuit 100A is in the sampling state and to be turned on when the sample hold circuit 100A is in the holding state. The voltage level of the first signal PH1 and the voltage level of the second signal PH2 are not high voltage levels at the same time. FIG. 2 illustrates the waveforms of the first signal PH1 and the second signal PH2. Referring to FIG. 2, the first signal PH1 and the second signal P112 are two rectangular wave signals reverse to each other. When the first signal PH1 is at a high voltage level, the second signal PH2 is at a low voltage level, and when the first signal PH1 is at the low voltage level, the second signal PH2 is at the high voltage level.

FIG. 3 is an equivalent circuit diagram of the sample hold circuit in FIG. 1 when the sample hold circuit is in the sampling state. Referring to FIG. 3, a short circuit is formed between the end T1 of the capacitor C1A and the end T2 of the capacitor C2A, and the voltage of the ends T1 and T2 is equal to a common voltage VCM, so that the charge provided by the waveform signal VIP and the ground signal VIN is stored in the capacitor C1A and the capacitor C2A. In addition, a short circuit is also formed between the output terminals VOP and VON, and because the voltage of the output terminals VOP and VON is equal to the common voltage VCM, no charge is stored in the capacitor C3A or the capacitor C4A. FIG. 4 is an equivalent circuit diagram of the sample hold circuit 100A in FIG. 1 when the sample hold circuit 100A is in the holding state. Referring to FIG. 4, the switches SW4A and SW5A connected with the capacitors C1A and C2A in parallel are turned on and accordingly respectively form a short circuit path between the two ends of the capacitor C1A and the capacitor C2A, so that the charge stored in the capacitors C1A and C2A when the sample hold circuit 100A is in the sampling state is transferred into the capacitors C3A, C4A, C5A, and C6A. The charge stored by the sample hold circuit 100A in the sampling state can be expressed as:

$$C1A \times (VIP-VCM) - C2A(VIN-VCM) \qquad (1)$$

The charge stored by the sample hold circuit 100A in the holding state can be expressed as:

$$C5A(VRP-VCM) - C6A(VRN-VCM) + C3A(VOP-VCM) - C4A(VON-VCM) \qquad (2)$$

Based on the charge conservation law, the total charge stored by the sample hold circuit 100A in both states can be expressed as:

$$C1A \times (VIP-VCM) - C2A(VIN-VCM) = C5A(VRP-VCM) - C6A(VRN-VCM) + C3A(VOP-VCM) - C4A(VON-VCM) \qquad (3)$$

Assuming the capacitance of each of the capacitors C1A-C6A is C, foregoing equation (3) is rewritten as:

$$C \times (VIP-VIN) = C \times (VOP-VON) + C \times (VRP-VRN) \qquad (4)$$

It can be obtained from foregoing equation that (VOP−VON)=(VIP−VIN)−(VRP−VRN), wherein (VRP−VRN) is the direct current (DC) portion in the sampled analog signal, and (VOP−VON) is the alternating current (AC) portion in the sampled analog signal. Thus, the sample hold circuit 100A can eliminate the DC voltage (VRP−VRN) in the analog signal and provide an input signal without the DC voltage (VRP−VRN) at the output terminals VOP and VON.

FIG. 5 illustrates the variation of the voltage difference (VRP−VRN) between the two reference voltages VRP and VRN in FIG. 1 along a time axis. Referring to FIG. 1 and FIG. 5, while in the holding state, the conventional sample hold circuit 100A eliminates the DC signal in an analog signal sampled when the sample hold circuit 100A is in the sampling state by using the capacitors coupled to the input terminals of the operational amplifier 102A and the reference voltages, so as to output the AC portion of the sampled analog signal. Because the conventional sample hold circuit 100A completely eliminates the DC signal in the analog signal at a time in the holding state by using the reference voltages and the capacitors, the voltage levels of the reference voltages are quickly pulled down to a low level when the sample hold circuit 100A enters the holding state. When the operation rate of the ADC increases, the reference voltages cannot return to their original voltage levels in time, so that the DC signal in the analog signal cannot be completely eliminated. As a result, the ADC outputs an incorrect signal.

SUMMARY OF THE INVENTION

Accordingly, the present invention is directed to a sample hold circuit and a method for sampling and holding a signal, wherein the operation rate of the sample hold circuit would be increased while error of the output signal of the sample hold circuit is prevented.

The present invention provides a sample hold circuit including a sample unit, a direct current (DC) voltage elimination unit, and a hold unit. The sample unit samples an input signal when the sample hold circuit is in a first state. The DC voltage elimination unit lowers a predetermined percentage of a DC voltage in the input signal sampled by the sample unit when the sample hold circuit is in the first state and eliminates a residual percentage of the DC voltage when the sample hold circuit is in a second state. The hold unit outputs an alternating current (AC) signal in the input signal sampled by the sample unit when the sample hold circuit is in the second state.

According to an embodiment of the present invention, the input signal includes a waveform signal and a ground signal.

According to an embodiment of the present invention, the sample unit includes a first switch, a second switch, a third switch, a fourth switch, a fifth switch, a sixth switch, a first capacitor, and a second capacitor. The first switch and the second switch respectively receive the waveform signal and the ground signal. The first end of the first capacitor is coupled to the first switch, and the first end of the second capacitor is coupled to the second switch. The third switch is coupled between the second end of the first capacitor and the second end of the second capacitor. The fourth switch is connected with the first capacitor in parallel. The fifth switch is connected with the second capacitor in parallel. The sixth switch is coupled between the second end of the first capacitor and a common voltage. The first switch, the second switch, the third switch, and the sixth switch are controlled by a first signal to be turned on in the first state and to be turned off in the second state. The fourth switch and the fifth switch are controlled by a second signal to be turned off in the first state and to be turned on in the second state.

According to an embodiment of the present invention, the hold unit includes an operational amplifier, a third capacitor, and a fourth capacitor. The positive input terminal and the negative input terminal of the operational amplifier are respectively coupled to the second end of the first capacitor and the second end of the second capacitor. The operational amplifier receives the input signal sampled by the sample unit and outputs the AC signal in the input signal from the first output terminal and the second output terminal of the operational amplifier. The third capacitor is coupled between the positive input terminal and the first output terminal of the operational amplifier. The fourth capacitor is coupled between the negative input terminal and the second output terminal of the operational amplifier.

According to an embodiment of the present invention, the voltage level of the first signal and the voltage level of the second signal are not high voltage levels at the same time.

According to an embodiment of the present invention, the DC voltage elimination unit includes a seventh switch, an eighth switch, a ninth switch, a tenth switch, an eleventh switch, a fifth capacitor, a sixth capacitor, a seventh capacitor, and an eighth capacitor. The seventh switch and the ninth switch receive a first reference voltage, and the eighth switch and the tenth switch receive a second reference voltage. The fifth capacitor is coupled between the seventh switch and the positive input terminal of the operational amplifier. The sixth capacitor is coupled between the eighth switch and the positive input terminal of the operational amplifier. The seventh capacitor is coupled between the ninth switch and the negative input terminal of the operational amplifier. The eighth capacitor is coupled between the tenth switch and the negative input terminal of the operational amplifier. The first end of the eleventh switch is coupled to the contact between the eighth switch and the sixth capacitor, and the second end of the eleventh switch is coupled to the contact between the ninth switch and the seventh capacitor. The eighth switch and the ninth switch are controlled by the first signal to be turned on in the first state and to be turned off in the second state. The seventh switch, the tenth switch, and the eleventh switch are controlled by the second signal to be turned off in the first state and to be turned on in the second state.

According to an embodiment of the present invention, the hold unit further includes a twelfth switch, wherein the twelfth switch is coupled between the first output terminal and the second output terminal of the operational amplifier and controlled by the first signal to be turned on in the first state and to be turned off in the second state.

According to an embodiment of the present invention, the waveform signal is a sinusoidal signal.

The present invention provides a method for sampling and holding a signal. First, an input signal is sampled by using a sample unit when a sample hold circuit is in a first state. Then, a predetermined percentage of a DC voltage in the input signal sampled by the sample unit is lowered when the sample hold circuit is in the first state by using a DC voltage elimination unit, and a residual percentage of the DC voltage is eliminated when the sample hold circuit is in a second state by using the DC voltage elimination unit. Finally, an AC signal in the input signal sampled by the sample unit is output when the sample hold circuit is in the second state by using a hold unit.

According to an embodiment of the present invention, the predetermined percentage is 50%.

As described above, in the present invention, a part of DC voltage in an input signal sampled by a sample hold circuit is respectively eliminated by using a DC voltage elimination unit when the sample hold circuit is in a sampling state and a holding state. Thereby, the situation that the reference voltages of the DC voltage take a long time to return to their original levels is avoided, so that the operation rate of the sample hold circuit is increased and error of the signals output by the sample hold circuit is prevented.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
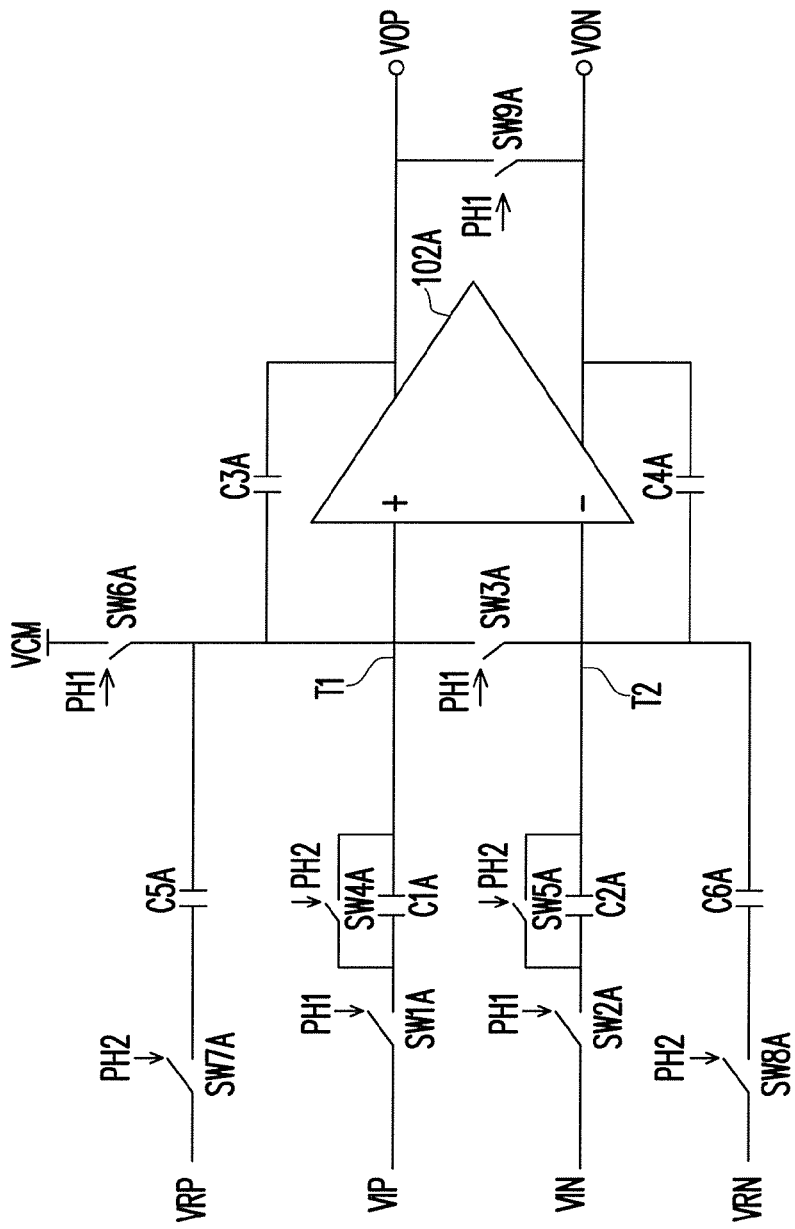
FIG. 1 is a circuit diagram of a conventional sample hold circuit.
Figure 2:
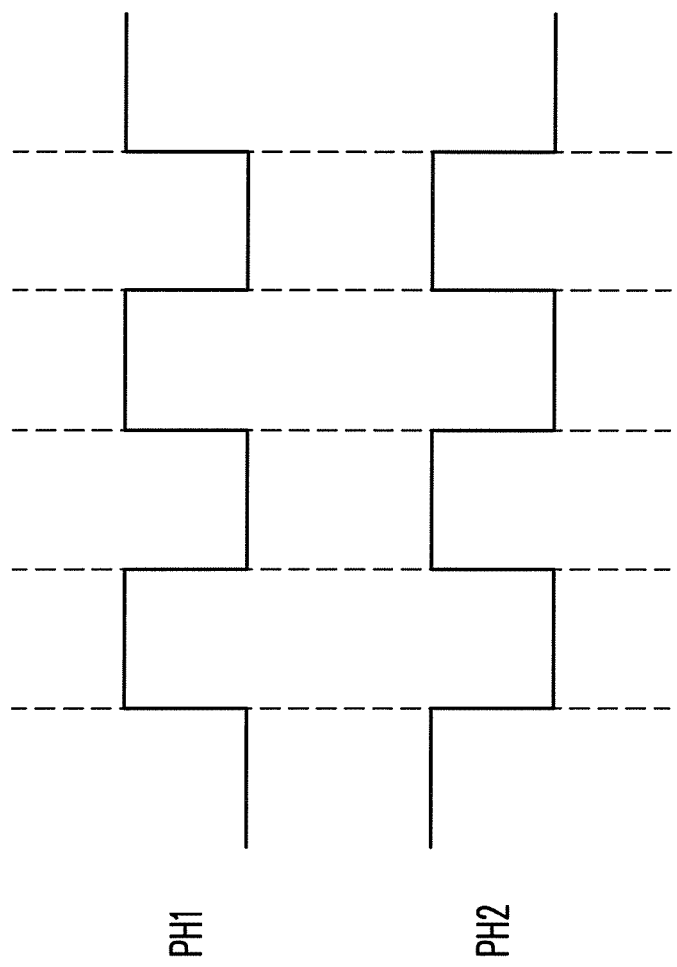
FIG. 2 illustrates the waveforms of a first signal and a second signal for controlling the sample hold circuit in FIG. 1.
Figure 3:
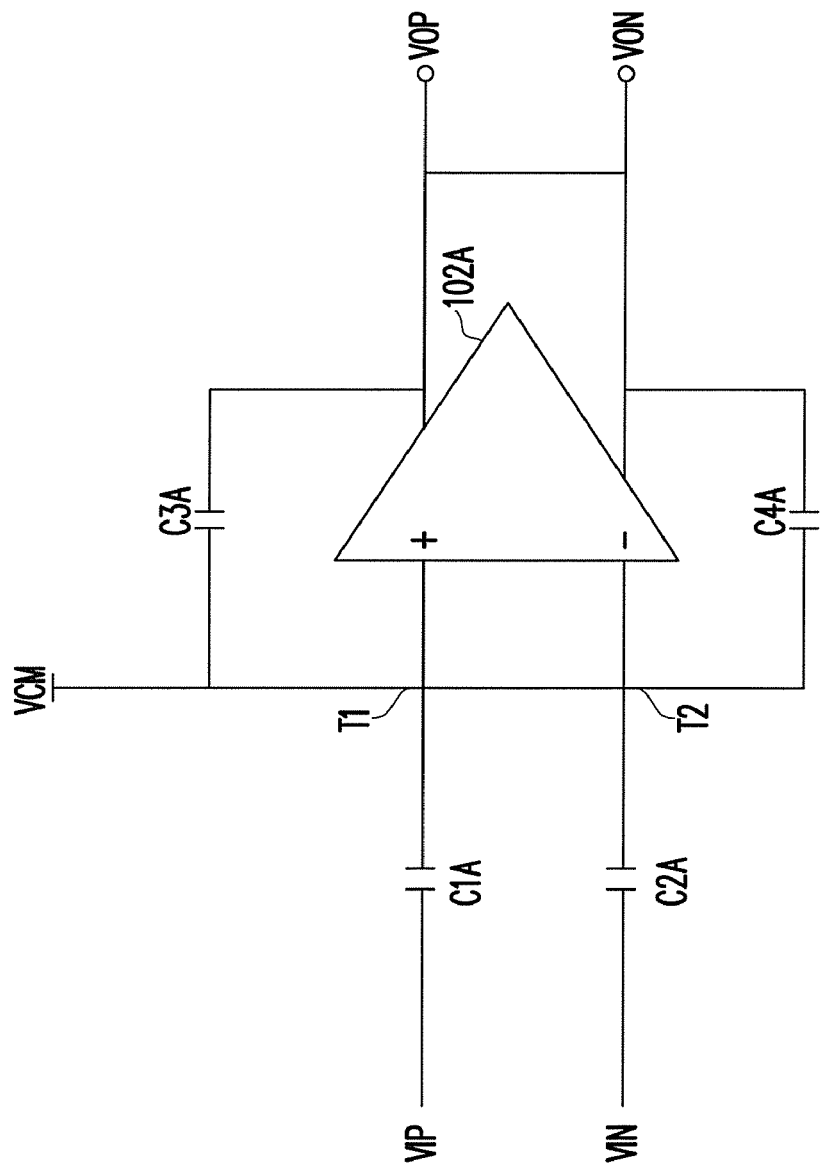
FIG. 3 is an equivalent circuit diagram of the sample hold circuit in FIG. 1 when the sample hold circuit is in a sampling state.
Figure 4:
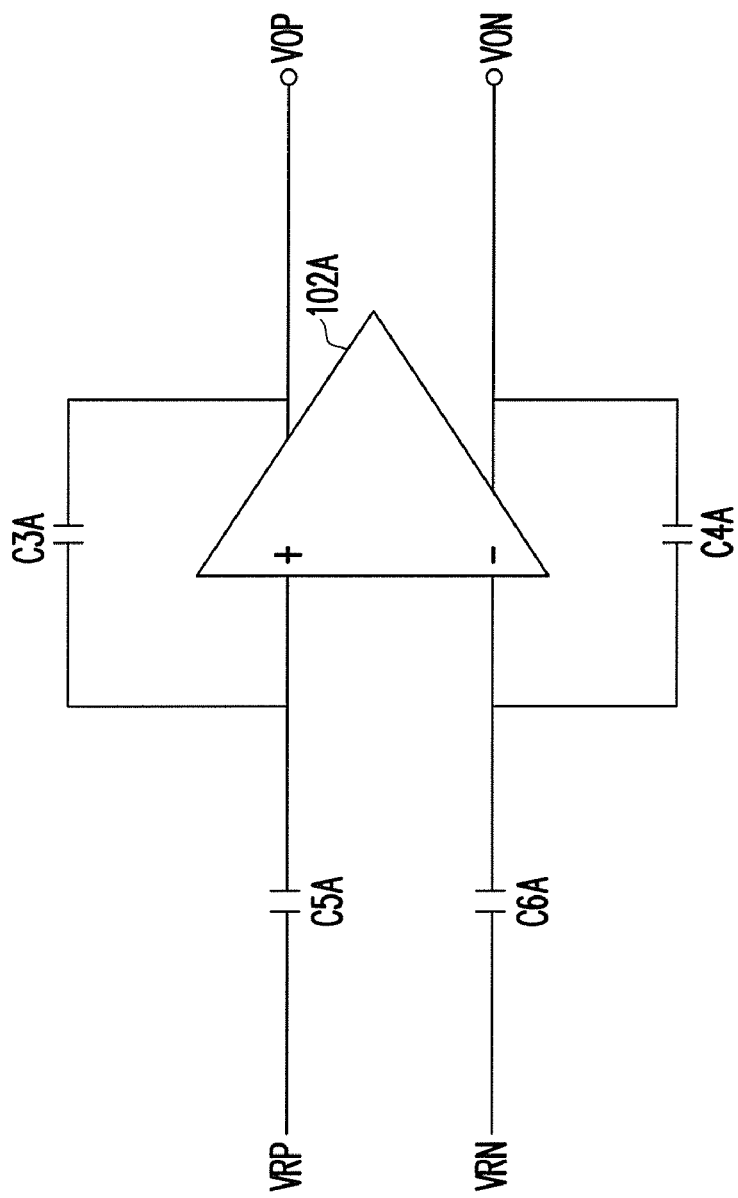
FIG. 4 is an equivalent circuit diagram of the sample hold circuit in FIG. 1 when the sample hold circuit is in a holding state.
Figure 5:
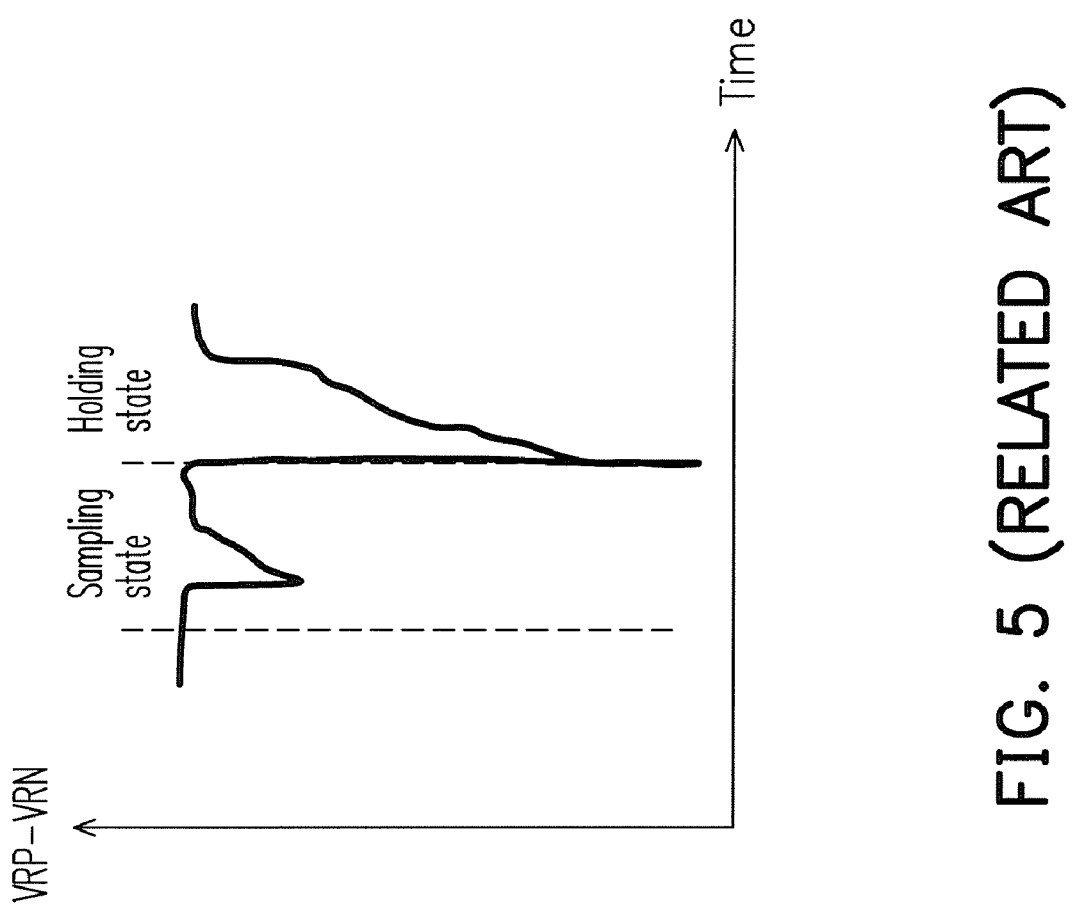
FIG. 5 illustrates the variation of a voltage difference between two reference voltages VRP and VRN in FIG. 1 along a time axis.

A sample hold circuit is disclosed in embodiments of the present invention. The sample hold circuit is adapted to a high-speed analog-to-digital converter (ADC), so that the sample hold circuit can quickly sample an analog signal in a sampling state and store the sampled analog signal in a holding state. Meanwhile, the sample hold circuit can eliminate the direct current (DC) portion of the analog signal and output the alternating current (AC) portion of the analog signal to the ADC to be converted into a digital signal.

Reference will now be made in detail to the present preferred embodiments of the invention, examples of which are illustrated in the accompanying drawings. Wherever possible, the same reference numbers are used in the drawings and the description to refer to the same or like parts.

Figure 6:
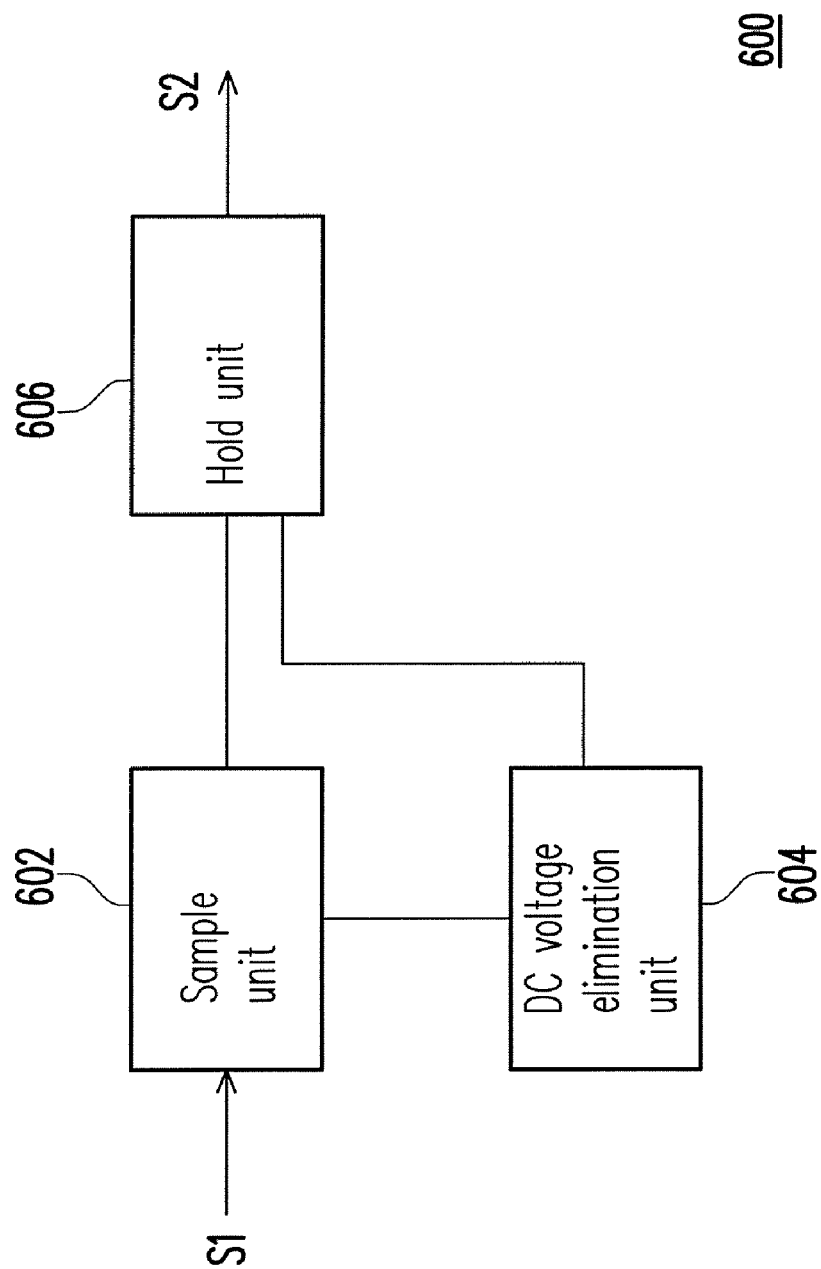
FIG. 6 is a diagram of a sample hold circuit according to an embodiment of the present invention.

FIG. 6 is a diagram of a sample hold circuit according to an embodiment of the present invention. Referring to FIG. 6, the sample hold circuit 600 includes a sample unit 602, a DC voltage elimination unit 604, and a hold unit 606. The sample unit 602 samples an input signal S1. The DC voltage elimination unit 604 eliminates the DC voltage in the signal sampled by the sample unit 602. The hold unit 606 stores and outputs an AC signal S2 after the DC voltage is eliminated from the input signal S1.

Figure 7:
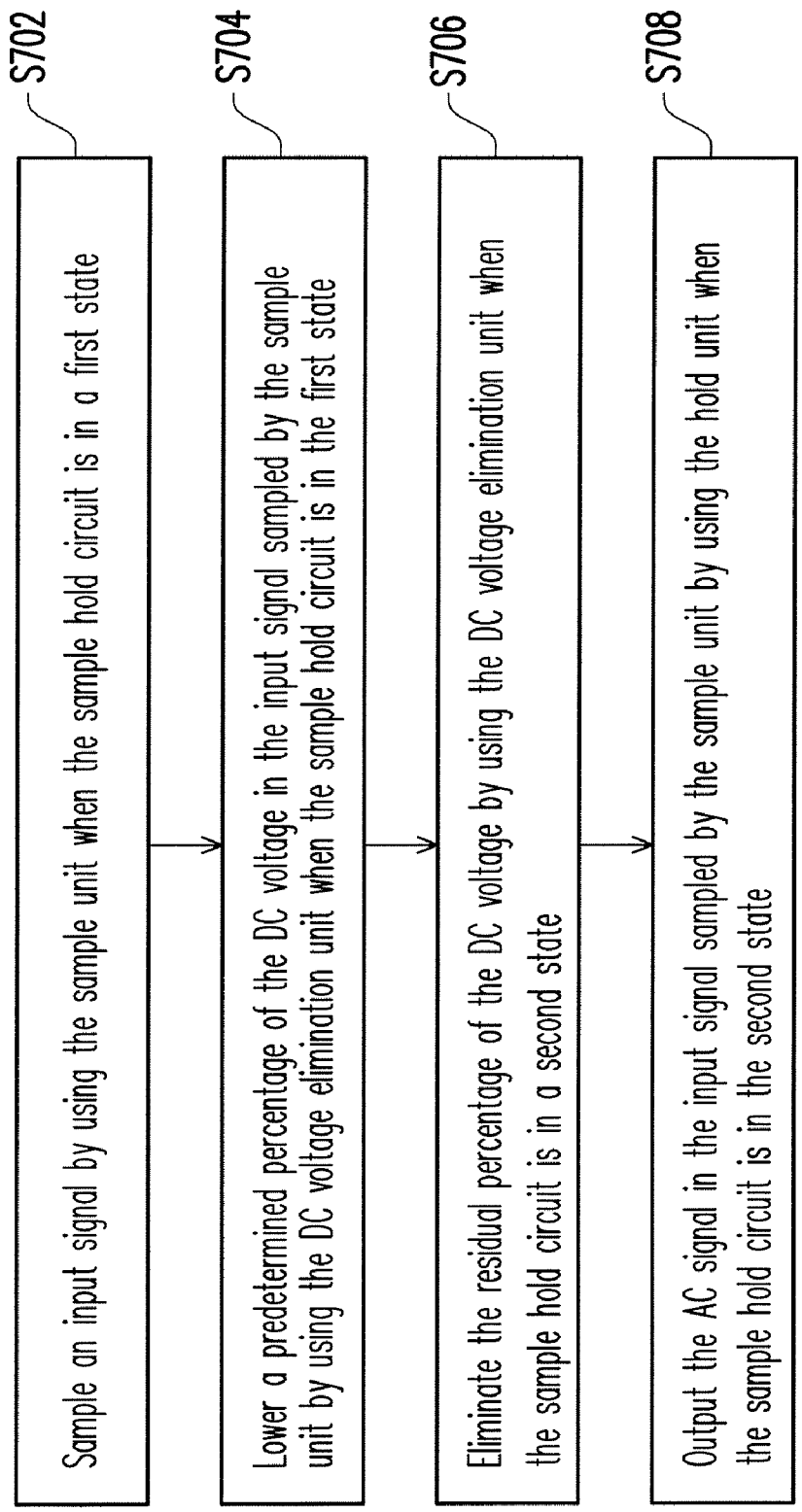
FIG. 7 is a flowchart of a method for sampling and holding a signal according to an embodiment of the present invention.

FIG. 7 is a flowchart of a method for sampling and holding a signal according to an embodiment of the present invention. Herein, the method for sampling and holding a signal will be described with reference to both FIG. 6 and FIG. 7. First, the sample unit 602 samples the input signal S1 when the sample hold circuit 600 is in a first state (e.g. a sampling state) (step S702). Then, the DC voltage elimination unit 604 coupled to the sample unit 602 lowers a predetermined percentage (e.g. 50%) of the DC voltage in the input signal S1 sampled by the sample unit 602 (step S704). It should be noted that herein the DC voltage is the central voltage level in the input signal S1. For example, if the input signal S1 is a sinusoidal signal and the peak voltage level thereof is 1V and the valley voltage level thereof is 0V, the central voltage level thereof is then 0.5V. The DC voltage elimination unit 604 lowers 50% of the DC voltage (i.e., lowers the central voltage level to 0.25V) when the sample hold circuit 600 is in the first state.

After that, when the sample hold circuit 600 enters a second state (e.g. a holding state), the DC voltage elimination unit 604 eliminates the residual 50% of the DC voltage (i.e., the DC voltage elimination unit 604 lowers the central voltage level to 0V) (step S706). Thus, the hold unit 606 coupled to the DC voltage elimination unit 604 outputs the AC signal S2 in the input signal S1 sampled by the sample unit 602 (i.e., the sample unit 602 outputs a signal having a central voltage level of 0V) when the sample hold circuit 600 is in the second state (step S708). As described above, the DC voltage elimination unit 604 lowers a part of the DC voltage in the input signal S1 sampled by the sample unit 602 when the sample hold circuit 600 is in the first state so that the voltage levels of the reference voltages are quickly pulled down to a low voltage level when the sample hold circuit 600 enters the second state. Accordingly, it is avoided from taking too much time while the reference voltages return to their original voltage levels. Therefore, the operation frequency of the sample hold circuit 600 is increased and error of the signal output by the sample hold circuit 600 is prevented.

Figure 8:
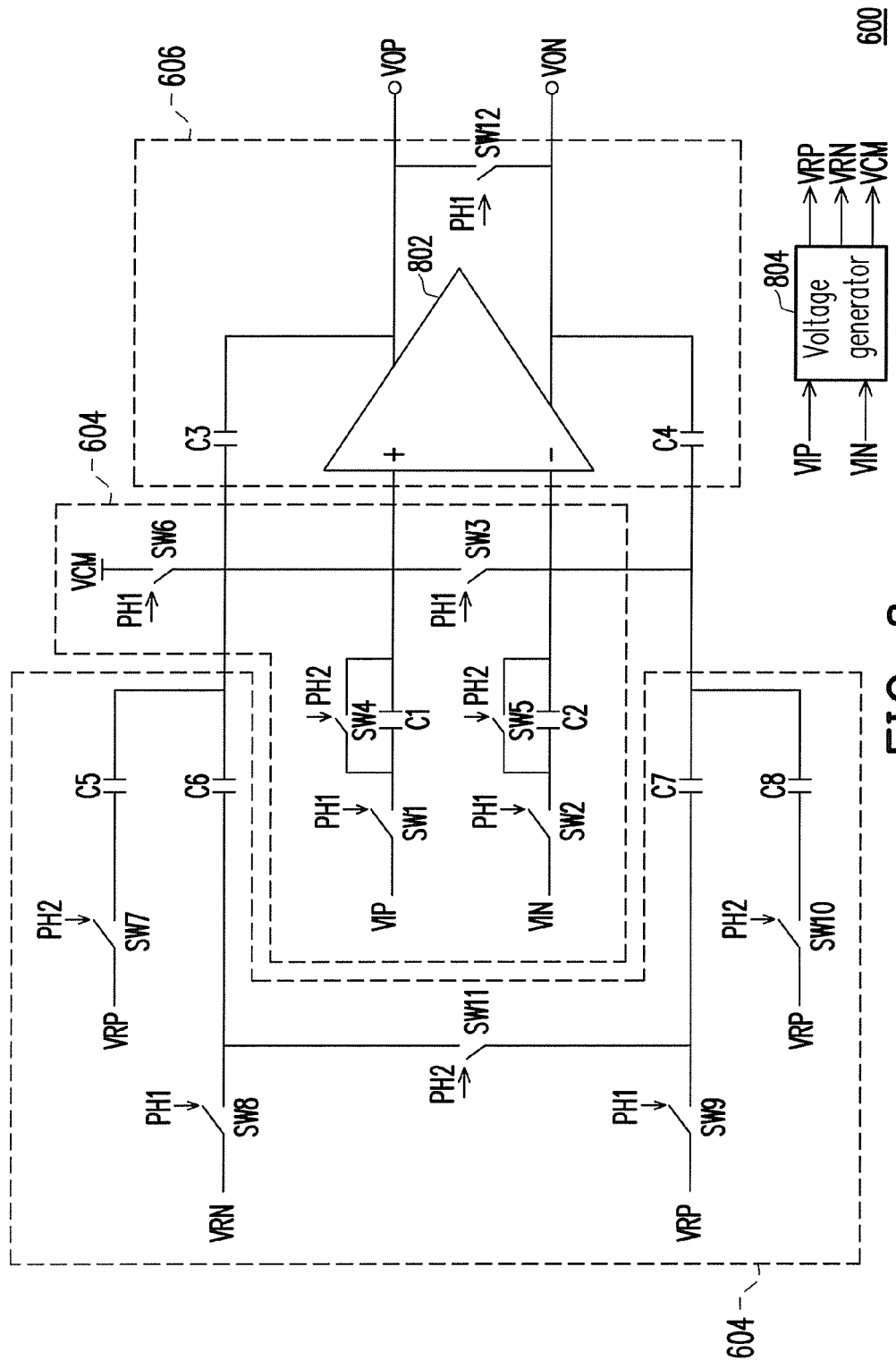
FIG. 8 is a circuit diagram of a sample hold circuit according to another embodiment of the present invention.

FIG. 8 is a circuit diagram of a sample hold circuit according to another embodiment of the present invention. Referring to FIG. 8, in more detail, the sample hold circuit 600 further includes a voltage generator 804, the input signal S1 includes a waveform signal VIP and a ground signal VIN, and the sample unit 602 includes switches SW1-SW6 and capacitors C1 and C2.

The switches SW1 and SW2 respectively receive the waveform signal VIP (e.g. a sinusoidal signal) and the ground signal VIN and are respectively coupled to the first end of the capacitor C1 and the first end of the capacitor C2. The switch SW3 is coupled between the second end of the capacitor C1 and the second end of the capacitor C2. The switches SW4 and SW5 are respectively connected with the capacitors C1 and C2 in parallel. The second end of the capacitor C1 is coupled to a common voltage VCM through the switch SW6. Besides, the voltage generator 804 outputs reference voltages VRP and VRN and the common voltage VCM, wherein the voltage difference between the reference voltage VRP and the reference voltage VRN is equal to the voltage difference between the waveform signal VIP and the ground signal VIN. It should be noted that in the present embodiment, the operation mode of the sample hold circuit 600 is a "clamp to ground" input mode (i.e., the voltage level of the ground signal VIN is 0V).

Additionally, the DC voltage elimination unit 604 includes switches SW7-SW11 and capacitors C5-C8. The capacitors C5 and C6 are coupled to the second end of the capacitor C1, the capacitors C7 and C8 are coupled to the second end of the capacitor C2, the capacitors C5 and C7 are respectively coupled to the reference voltage VRP through the switches SW7 and SW9, and the capacitors C6 and C8 are respectively coupled to the reference voltage VRN through the switches SW8 and SW10. Besides, the switch S11 is coupled between the common contact of the switch SW8 and the capacitor C6 and the common contact of the switch SW9 and the capacitor C7.

The hold unit 606 includes an operational amplifier 802, a switch SW12, and capacitors C3 and C4. The positive input terminal and the negative input terminal of the operational amplifier 802 are respectively coupled to the second end of the capacitor C1 and the second end of the capacitor C2. The switch SW12 is coupled between the output terminals VOP and VON of the operational amplifier 802. The capacitor C3 is coupled between the positive input terminal and the output terminal VOP of the operational amplifier 802, and the capacitor C4 is coupled between the negative input terminal and the output terminal VON of the operational amplifier 802.

The switches SW1-SW3, the switch SW6, the switch SW8, the switch SW9, and the switch SW12 are controlled by a first signal PH1 to be turned on when the sample hold circuit 600 is in the first state and to be turned off when the sample hold circuit 600 is in the second state. In addition, the switches SW4, SW5, SW7, SW10, and SW11 are controlled by a second signal PH2 to be turned off when the sample hold circuit 600 is in the first state and to be turned on when the sample hold circuit 600 is in the second state. The voltage level of the first signal PH1 and the voltage level of the second signal PH2 are not high voltage levels at the same time.

Figure 9:
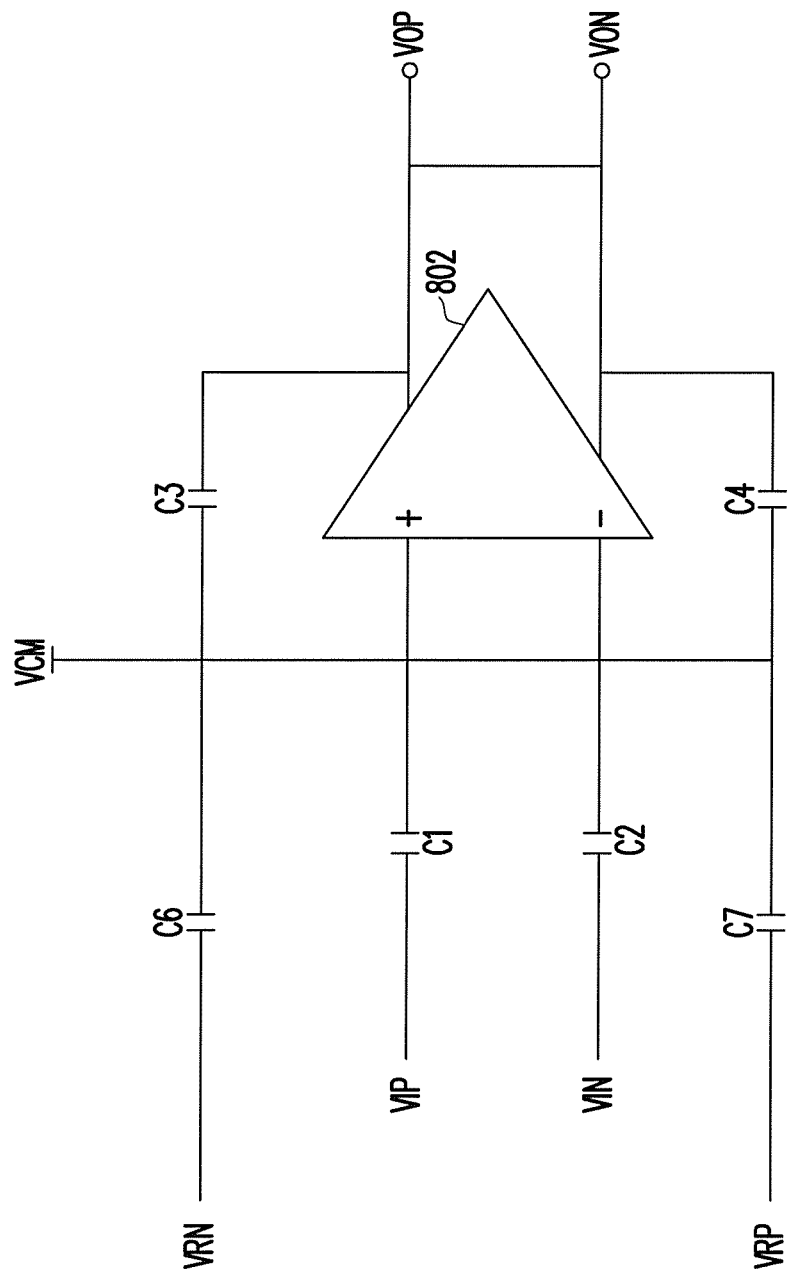
FIG. 9 is an equivalent circuit diagram of the sample hold circuit in FIG. 8 when the sample hold circuit is in a first state.

FIG. 9 is an equivalent circuit diagram of the sample hold circuit 600 when the sample hold circuit 600 is in the first state. Referring to FIG. 9, the switches SW1 and SW2 are turned on, and the switches SW4 and SW5 are turned off. Thus, the capacitors C1 and C2 can receive the waveform signal VIP and the ground signal VIN through the switches SW1 and SW2. In addition, the switches SW3 and SW6 are also turned on so that a short circuit is formed between the second ends of the capacitors C1 and C2, and the voltage of the second ends of the capacitors C1 and C2 is equivalent to the common voltage VCM. Accordingly, the charge provided by the waveform signal VIP and ground signal VIN is stored in the capacitors C1 and C2. Additionally, because the switch SW3 is turned on, a short circuit is also formed between the second end of the capacitor C6 and the second end of the capacitor C7, and the voltage of the second ends of the capacitors C6 and C7 is also equal to the common voltage VCM. Accordingly, the charge provided by the reference voltages VRN and VRP is stored in the capacitors C6 and C7 respectively through the turned-on switches SW8 and SW9. Besides, herein the switch SW12 is turned on so that a short circuit is also formed between the output terminals VOP and VON. Because the voltage of the output terminals VOP and VON is equal to the common voltage VCM, no charge is stored in the capacitors C3 and C4.

Figure 10:
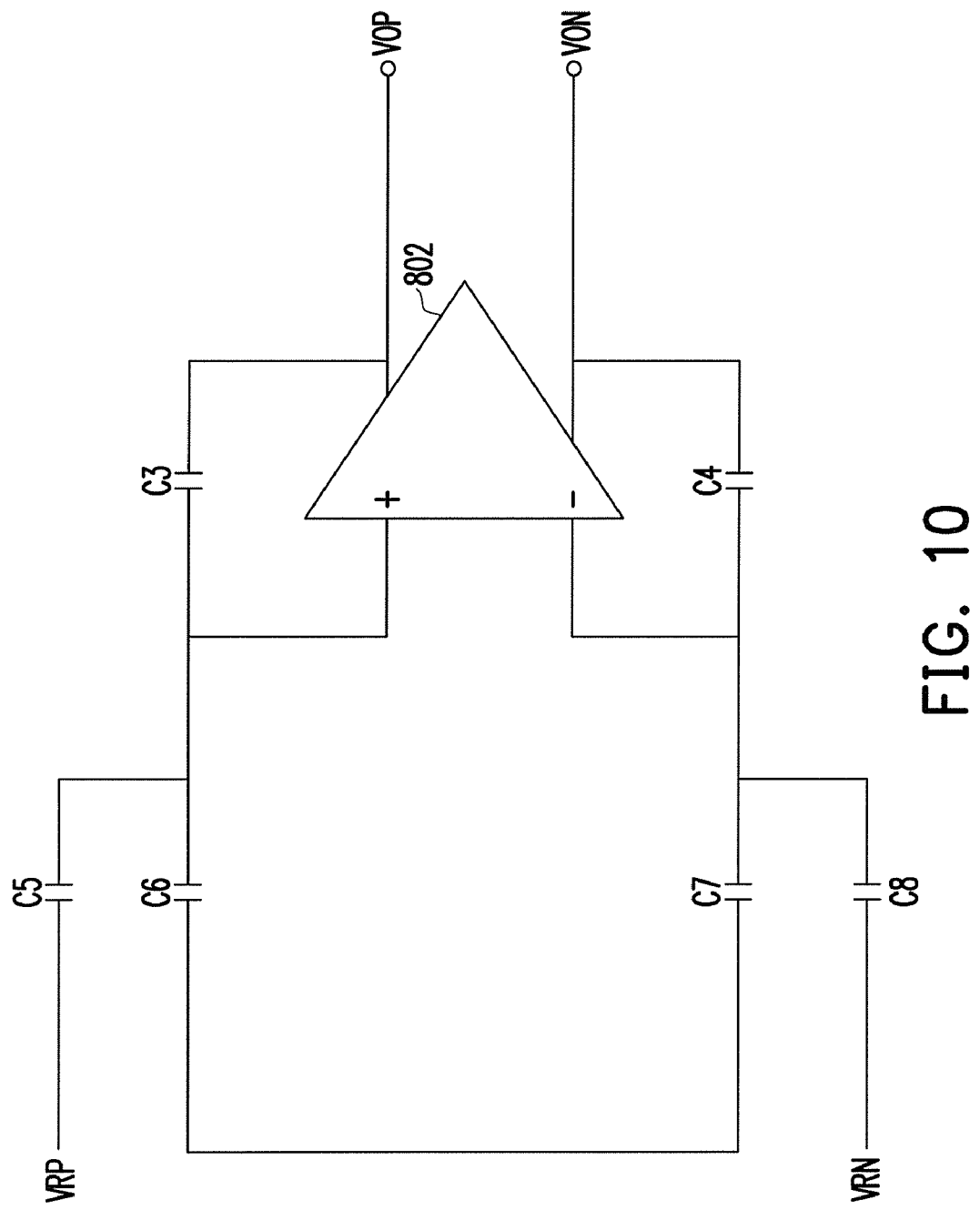
FIG. 10 is an equivalent circuit diagram of the sample hold circuit in FIG. 8 when the sample hold circuit is in a second state.

FIG. 10 is an equivalent circuit diagram of the sample hold circuit 600 in FIG. 8 when the sample hold circuit 600 is in the second state. Referring to FIG. 10, when the sample hold circuit 600 is in the second state, the switches SW1 and SW2 are turned off, and the switches SW4 and SW5 connected with the capacitors C1 and C2 in parallel are turned on. Accordingly, a short circuit path is respectively formed between the two ends of the capacitor C1 and the capacitor C2, so that the charge stored in the capacitors C1 and C2 as the sample hold circuit 600 is in the first state is released. Because the switch SW11 is turned on, a short circuit path is also formed between the capacitors C6 and C7. Besides, because the switches SW7 and SW10 are turned on, the capacitors C5 and C8 are connected to the reference voltages VRN and VRP. Through foregoing operations of the switches, the charge stored in the capacitors is re-arranged. The charge stored by the sample hold circuit 600 in the sampling state can be expressed as:

C1×(VIP−VCM)−C2(VIN−VCM)+C6(VRN−VCM)−C7(VRP−VCM) (5)

The charge stored by the sample hold circuit 600 in the holding state can be expressed as:

C5×(VRP−VCM)−C8(VRN−VCM)+C3(VOP−VCM)−C4(VON−VCM) (6)

Based on the charge conservation law, the total charge stored when the sample hold circuit 600 is in the first state is equal to that stored when the sample hold circuit 600 is in the second state. Thus, the total charge of the sample hold circuit 600 in both states can be expressed as:

C1×(VIP−VCM)−C2(VIN−VCM)+C6(VRN−VCM)−C7(VRP−VCM)=C5×(VRP−VCM)−C8(VRN−VCM)+C3(VOP−VCM)−C4(VON−VCM) (7)

Herein it is assumed that each of the capacitors C1-C4 has the same capacitance (assumed to be C), and the capacitance of each of the capacitors C5-C8 is half of the capacitance of each of the capacitors C1-C4 (i.e., the capacitance of each of the capacitors C5-C8 is C/2). Accordingly, foregoing equation (7) is rewritten as:

$$C \times (VIP - VIN) - \frac{C}{2}(VRP - VRN) = C \times (VOP - VON) + \frac{C}{2}(VRP - VRN) \qquad (8)$$

It can be obtained from foregoing equation (8) that (VOP−VON)=(VIP−VIN)−(VRP−VRN), wherein (VRP−VRN) is the DC signal in the input signal S1, and (VOP−VON) is the AC signal in the input signal S1. Thus, the sample hold circuit 600 in the present embodiment can eliminate the DC voltage in the input signal S1 sampled by the sample unit 602, so that the AC signal S2 in the input signal S1 can be obtained at the output terminals VOP and VON. In addition, according to the left side of equation (8), it can be understood that the DC voltage in the sampled input signal is lowered for 50% when the sample hold circuit 600 is in the first state. Moreover, according to the right side of equation (8), it can be understood that the residual 50% of the DC voltage in the input signal is eliminated when the sample hold circuit 600 is in the second state.

Figure 11:
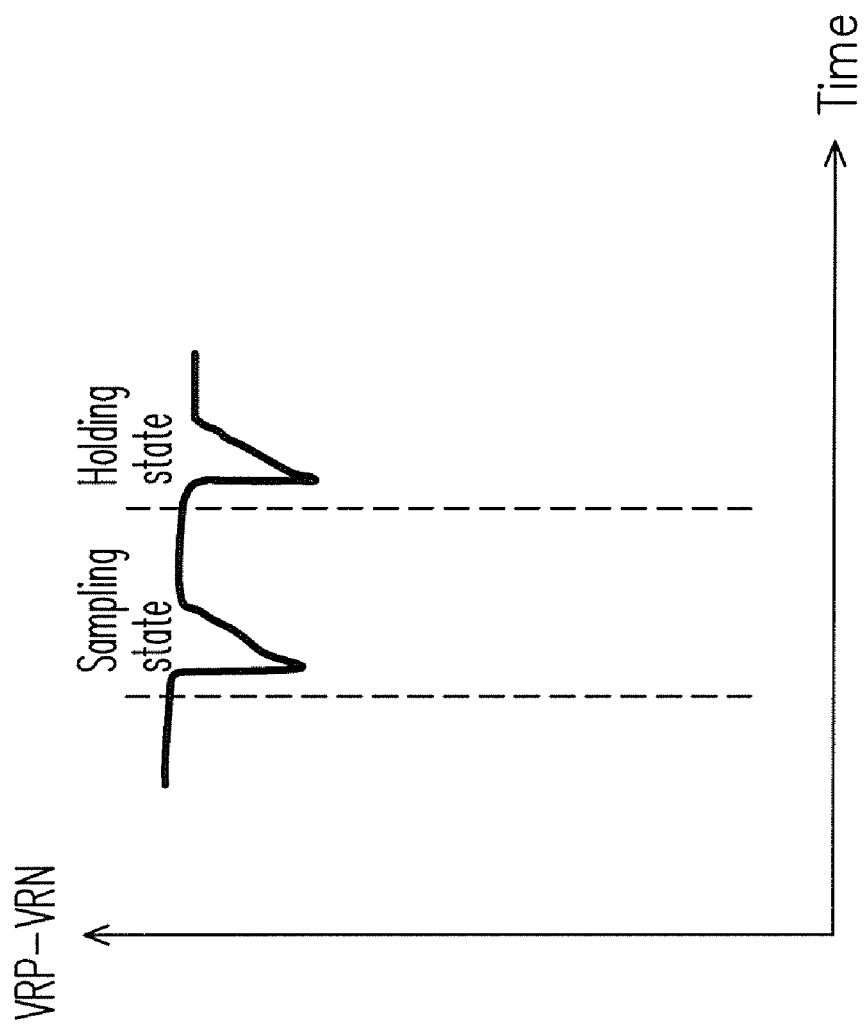
FIG. 11 illustrates the variation of a voltage difference between two reference voltages VRP and VRN in FIG. 8 along a time axis.

FIG. 11 illustrates the variation of the voltage difference (VRP−VRN) between the two reference voltages VRP and VRN in FIG. 8 along a time axis. Referring to both FIG. 8 and FIG. 11, a part of the DC voltage is eliminated through the capacitors C6 and C7 when the sample hold circuit 600 is in the first state, and the residual DC voltage is eliminated through the capacitors C5 and C8 when the sample hold circuit 600 is in the second state. Thus, the voltage difference (VRP−VRN) is prevented from being instantly pulled down by a great value while a current instantly is extracted from the voltage generator 804. Thereby, it does not take very much time for the sample hold circuit 600 to wait for the reference voltages VRP and VRN provided by the voltage generator 804 to return to their original levels. Accordingly, the sample hold circuit 600 can perform the next sample hold action quickly. As shown in FIG. 11, when the sample hold circuit 600 is in the first state, a part of the current in the voltage generator 804 is extracted by the capacitors C6 and C7, and when the sample hold circuit 600 is in the second state, another part of the current in the voltage generator 804 is extracted by the capacitors C5 and C8. Even though the voltage difference (VRP−VRN) of the voltage generator 804 when the sample hold circuit 600 is in the first state is slightly higher than that in the conventional sample hold circuit 100A, the voltage difference (VRP−VRN) of the voltage generator 804 when the sample hold circuit 600 is in the second state is reduced. Accordingly, by eliminating the DC voltage twice within a sample-hold period, the operation frequency of the sample hold circuit 600 is greater than that of the conventional sample hold circuit 100A.

It should be noted that in the present embodiment, the capacitance of each of the capacitors C5-C8 is half of the capacitance of each of the capacitors C1-C4 so that half of the DC voltage is lowered when the sample hold circuit 600 is in the first state. However, the present invention is not limited thereto, and the percentages of the DC voltage to be eliminated when the sample hold circuit 600 is in the first state and the second state can be determined according to the actual requirement by adjusting the reference voltages VRP and VRP and the capacitance of each capacitor.

As described above, in the present invention, a part of the DC voltage in an input signal sampled by a sample hold circuit is eliminated by using a DC voltage elimination unit when the sample hold circuit is in a first state, and the residual DC voltage is eliminated by using the DC voltage elimination unit when the sample hold circuit is in a second state. Thereby, the situation that the reference voltages used for eliminating the DC voltage take too much time to return to their original levels is avoided. Accordingly, the operation speed of the sample hold circuit is increased, and error of the signals output by the sample hold circuit is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sample hold circuit, comprising:
    a sample unit, configured to sample an input signal when the sample hold circuit is in a first state, wherein the input signal comprises a waveform signal and a ground signal, and the sample unit comprises:
        a first switch, configured to receive the waveform signal;
        a second switch, configured to receive the ground signal;
        a first capacitor, a first end of the first capacitor being coupled to the first switch;
        a second capacitor, a first end of the second capacitor being coupled to the second switch;
        a third switch, coupled between a second end of the first capacitor and a second end of the second capacitor;
        a fourth switch, connected with the first capacitor in parallel;
        a fifth switch, connected with the second capacitor in parallel; and
        a sixth switch, coupled between the second end of the first capacitor and a common voltage;
    a direct current (DC) voltage elimination unit, coupled to the sample unit, configured to lower a predetermined percentage of a DC voltage in the input signal sampled by the sample unit when the sample hold circuit is in the first state, and configured to eliminate a residual percentage of the DC voltage when the sample hold circuit is in a second state; and
    a hold unit, coupled to the sample unit and the DC voltage elimination unit, configured to output an alternating current (AC) signal in the input signal sampled by the sample unit when the sample hold circuit is in the second state;
    wherein the first switch, the second switch, the third switch, and the sixth switch are controlled by a first signal to be turned on in the first state and to be turned off in the second state;
    wherein the fourth switch and the fifth switch are controlled by a second signal to be turned off in the first state and to be turned on in the second state.

2. The sample hold circuit according to claim 1, wherein the hold unit comprises:
    an operational amplifier, having a positive input terminal and a negative input terminal respectively coupled to the second end of the first capacitor and the second end of the second capacitor, the operational amplifier receiving the input signal sampled by the sample unit and outputting the AC signal in the input signal at a first output terminal and a second output terminal of the operational amplifier;
    a third capacitor, coupled between the positive input terminal and the first output terminal of the operational amplifier; and
    a fourth capacitor, coupled between the negative input terminal and the second output terminal of the operational amplifier.

3. The sample hold circuit according to claim 2, wherein the hold unit further comprises:
    a twelfth switch, coupled between the first output terminal and the second output terminal of the operational amplifier, and controlled by the first signal to be turned on in the first state and to be turned off in the second state.

4. The sample hold circuit according to claim 1, wherein a voltage level of the first signal and a voltage level of the second signal are not high voltage levels at a same time.

5. The sample hold circuit according to claim 1, wherein the DC voltage elimination unit comprises:
    a seventh switch, configured to receive a first reference voltage;
    an eighth switch, configured to receive a second reference voltage;
    a ninth switch, configured to receive the first reference voltage;
    a tenth switch, configured to receive the second reference voltage;
    a fifth capacitor, coupled between the seventh switch and a positive input terminal of an operational amplifier;
    a sixth capacitor, coupled between the eighth switch and the positive input terminal of the operational amplifier;
    a seventh capacitor, coupled between the ninth switch and a negative input terminal of the operational amplifier;
    an eighth capacitor, coupled between the tenth switch and the negative input terminal of the operational amplifier; and
    an eleventh switch, a first end of the eleventh switch being coupled to a contact between the eighth switch and the sixth capacitor, and a second end of the eleventh switch being coupled to a contact between the ninth switch and the seventh capacitor;
    wherein the eighth switch and the ninth switch are controlled by the first signal to be turned on in the first state and to be turned off in the second state;
    wherein the seventh switch, the tenth switch, and the eleventh switch are controlled by the second signal to be turned off in the first state and to be turned on in the second state.

6. The sample hold circuit according to claim 1, wherein the waveform signal is a sinusoidal signal.

7. The sample hold circuit according to claim 1, wherein the predetermined percentage is 50%.

8. A sample hold circuit, comprising:
    a sample unit, configured to sample an input signal when the sample hold circuit is in a first state, wherein the input signal comprises a waveform signal and a ground signal;
    a direct current (DC) voltage elimination unit, coupled to the sample unit, configured to lower a predetermined percentage of a DC voltage in the input signal sampled by the sample unit when the sample hold circuit is in the first state, and configured to eliminate a residual percentage of the DC voltage when the sample hold circuit is in a second state, wherein the DC voltage elimination unit comprises:
        a seventh switch, configured to receive a first reference voltage;
        an eighth switch, configured to receive a second reference voltage;

a ninth switch, configured to receive the first reference voltage;

a tenth switch, configured to receive the second reference voltage;

a fifth capacitor, coupled between the seventh switch and a positive input terminal of an operational amplifier;

a sixth capacitor, coupled between the eighth switch and the positive input terminal of the operational amplifier;

a seventh capacitor, coupled between the ninth switch and a negative input terminal of the operational amplifier;

an eighth capacitor, coupled between the tenth switch and the negative input terminal of the operational amplifier; and an eleventh switch, a first end of the eleventh switch being coupled to a contact between the eighth switch and the sixth capacitor, and a second end of the eleventh switch being coupled to a contact between the ninth switch and the seventh capacitor, wherein the eighth switch and the ninth switch are controlled by the first signal to be turned on in the first state and to be turned off in the second state, and the seventh switch, the tenth switch, and the eleventh switch are controlled by the second signal to be turned off in the first state and to be turned on in the second state; and a hold unit, coupled to the sample unit and the DC voltage elimination unit, configured to output an alternating current (AC) signal in the input signal sampled by the sample unit when the sample hold circuit is in the second state.

9. The sample hold circuit according to claim 8, wherein the sample unit comprises:

a first switch, configured to receive the waveform signal;

a second switch, configured to receive the ground signal;

a first capacitor, a first end of the first capacitor being coupled to the first switch;

a second capacitor, a first end of the second capacitor being coupled to the second switch;

a third switch, coupled between a second end of the first capacitor and a second end of the second capacitor;

a fourth switch, connected with the first capacitor in parallel;

a fifth switch, connected with the second capacitor in parallel; and a sixth switch, coupled between the second end of the first capacitor and a common voltage;

wherein the first switch, the second switch, the third switch, and the sixth switch are controlled by a first signal to be turned on in the first state and to be turned off in the second state;

wherein the fourth switch and the fifth switch are controlled by a second signal to be turned off in the first state and to be turned on in the second state.

10. The sample hold circuit according to claim 9, wherein the hold unit comprises:

the operational amplifier, wherein the positive input terminal and the negative input terminal of the operational amplifier are respectively coupled to the second end of the first capacitor and the second end of the second capacitor, the operational amplifier receives the input signal sampled by the sample unit and outputs the AC signal in the input signal at a first output terminal and a second output terminal of the operational amplifier;

a third capacitor, coupled between the positive input terminal and the first output terminal of the operational amplifier; and a fourth capacitor, coupled between the negative input terminal and the second output terminal of the operational amplifier.

11. The sample hold circuit according to claim 10, wherein the hold unit further comprises:

a twelfth switch, coupled between the first output terminal and the second output terminal of the operational amplifier, and controlled by the first signal to be turned on in the first state and to be turned off in the second state.

12. The sample hold circuit according to claim 9, wherein a voltage level of the first signal and a voltage level of the second signal are not high voltage levels at a same time.

13. The sample hold circuit according to claim 8, wherein the waveform signal is a sinusoidal signal.

14. The sample hold circuit according to claim 8, wherein the predetermined percentage is 50%.

* * * * *